(12) United States Patent
Simms et al.

(10) Patent No.: US 9,808,944 B2
(45) Date of Patent: Nov. 7, 2017

(54) METHODS OF MANUFACTURING SILICON BLADES FOR SHAVING RAZORS

(71) Applicant: The Gillette Company, Boston, MA (US)

(72) Inventors: Graham John Simms, Reading (GB); Peter Johannus Leussink, Enschede (NL); Neville Sonnenberg, Newton, MA (US)

(73) Assignee: The Gillette Company LLC, Boston, MA (US)

( * ) Notice: Subject to any disclaimer, the term of this patent is extended or adjusted under 35 U.S.C. 154(b) by 329 days.

(21) Appl. No.: 14/306,702

(22) Filed: Jun. 17, 2014

(65) Prior Publication Data

US 2015/0360376 A1    Dec. 17, 2015

(51) Int. Cl.
*B26B 21/40* (2006.01)
*B26B 21/56* (2006.01)
(Continued)

(52) U.S. Cl.
CPC .......... *B26B 21/4068* (2013.01); *B26B 21/58* (2013.01); *B26B 21/60* (2013.01); *C30B 29/06* (2013.01); *C30B 33/08* (2013.01)

(58) Field of Classification Search
CPC ..... B26B 21/4068; B26B 21/58; B26B 21/60; C30B 29/06; C30B 33/08
(Continued)

(56) References Cited

U.S. PATENT DOCUMENTS

| 4,534,827 A | * | 8/1985 | Henderson ......... A61B 17/3211 216/101 |
| 6,615,496 B1 | | 9/2003 | Fleming et al. |

(Continued)

FOREIGN PATENT DOCUMENTS

| JP | 2004141360 | 5/2004 |
| WO | WO 0064644 | 11/2000 |

(Continued)

OTHER PUBLICATIONS

PCT International Search Report with Written Opinion in corresponding Int'l appln. PCT/US2015/035910 dated Sep. 24, 2015.

*Primary Examiner* — Omar Flores Sanchez
(74) *Attorney, Agent, or Firm* — Joanne N. Pappas; Kevin C. Johnson; Steven W. Miller

(57) ABSTRACT

Methods are provided for the manufacture of razor blades from silicon material. In some implementations, the method includes aligning a mono-crystalline silicon wafer comprising a {100} surface at an angle where {111} planes intersect the {100} surface parallel and perpendicular to the wafer; etching the mono-crystalline silicon wafer to expose an {111} plane and a second plane to provide a blade edge having between about a 20 degree included blade angle and about a 35 degree included blade angle; applying a hard coating on the blade edge; providing a radius of curvature of the blade edge between about 20 nanometers and about 100 nanometers after deposition of the hard coating; applying a soft coating on the blade edge; and removing the razor blade from the mono-crystalline silicon wafer.

19 Claims, 6 Drawing Sheets

(51) Int. Cl.
*B26B 21/60* (2006.01)
*B26B 21/58* (2006.01)
*C30B 29/06* (2006.01)
*C30B 33/08* (2006.01)

(58) Field of Classification Search
USPC ......... 438/753, 745; 30/346.54–345.55, 350; 76/101.1, 104.1
See application file for complete search history.

(56) References Cited

U.S. PATENT DOCUMENTS

| | | | |
|---|---|---|---|
| 8,499,673 B2 | 8/2013 | Keller | |
| 2005/0210684 A1* | 9/2005 | Newman | A61B 17/32 30/350 |
| 2008/0155839 A1* | 7/2008 | Anderson | B25G 1/10 30/350 |
| 2014/0230252 A1* | 8/2014 | Davos | B26B 21/4031 30/50 |

FOREIGN PATENT DOCUMENTS

| | | |
|---|---|---|
| WO | WO 2005027729 | 3/2005 |
| WO | WO 2007/092852 | 8/2007 |
| WO | WO2014144424 A1 | 9/2014 |

\* cited by examiner

METHODS OF MANUFACTURING SILICON BLADES FOR SHAVING RAZORS

FIELD OF THE INVENTION

This invention relates to methods of manufacturing blades for shaving razors, and more particularly to manufacturing blades for shaving razors from silicon.

BACKGROUND OF THE INVENTION

Razor blades are typically formed of a suitable metallic sheet material such as stainless steel, which is slit to a desired width and heat-treated to harden the metal. The hardening operation utilizes a high temperature furnace, where the metal may be exposed to temperatures greater than 1145° C. for up to about 20 seconds, followed by quenching, whereby the metal is rapidly cooled to obtain certain desired material properties.

After hardening, a cutting edge is formed on the blade. The cutting edge typically has a wedge-shaped configuration with an ultimate tip having a radius less than about 1000 angstroms, e.g., about 200-300 angstroms. However, blade edge radii can range from 300 angstroms to 10,000 angstroms due to inherent limitations in the manufacture process using metallic sheet material.

The advantage of this prior method is that it is a proven, economical process for making blades in high volume at high speed. However, it is ever desirable to find processes that can further reduce edge quality variability in order to achieve improved sharpness consistency, and can form blade edges of increased strength that will result in a lower force required to trim hair, thereby improving comfort during shaving. It would be particularly desirable if such a process could utilize lower cost materials for blade formation.

Therefore, there is a need for a lower cost method of making blades for shaving razors having increased edge strength and less variability in edge sharpness to provide an improved shaving experience.

SUMMARY OF THE INVENTION

The present invention provides a simple, efficient method for producing razor blades from a silicon wafer. Moreover, some methods are suitable for producing blade boxes comprising a plurality of razor blades formed in a single silicon wafer to be disposed as a single unit in a razor cartridge.

In one aspect, the method includes aligning a mono-crystalline silicon wafer comprising a {100} surface at an angle where {111} planes intersect the {100} surface parallel and perpendicular to the wafer. The wafer undergoes etching to expose an {111} plane and a second plane to provide a blade edge having between about a 20 degree included blade angle and about a 35 degree included blade angle. A hard coating is applied on the blade edge providing a radius of curvature of the blade edge between about 20 nanometers and about 100 nanometers after deposition of the hard coating. A soft coating is then applied on the blade edge. The razor blade is removed from the mono-crystalline silicon wafer. The second plane can be the {110} plane, or it can be the {552} plane.

In some aspects, a masking layer can be applied to the mono-crystalline silicon wafer. The masking layer can be patterned to define the blade angle profile of the razor blade. The masking layer can be removed before applying the hard coating. The hard coating can comprise diamond, diamond-like carbon, amorphous diamond, boron nitride, niobium nitride, silicon nitride, chromium nitride, zirconium nitride, titanium nitride, silicon carbide, alumina, zirconia, or any combination thereof. A second masking layer can be applied to the wafer before applying the soft coating. The soft coating can comprise polytetrafluoroethylene. The hard coating can be applied before removing the razor blade from the silicon wafer.

In other aspects, the razor blade is formed into a blade box comprising a plurality of razor blades on the silicon wafer. The blade box can have a rectangular perimeter enclosing the plurality of razor blades.

In still other aspects, the razor blade can be disposed in a razor cartridge housing or, the entire blade box can be disposed in a razor cartridge.

The details of one or more embodiments of the invention are set forth in the accompanying drawings and the description below. Other features, objects, and advantages of the invention will be apparent from the description and drawings, and from the claims.

DETAILED DESCRIPTION OF THE DRAWINGS

FIG. 1b is a side view of the silicon razor blade of FIG. 1a.

FIG. 2b is a side view of the silicon razor blade of FIG. 2a.

DETAILED DESCRIPTION OF THE INVENTION

The methods of the present disclosure provide for the manufacture of blades for shaving devices or razors. Specifically, disclosed are methods for manufacturing razor blades for shaving devices from silicon material. Accordingly, the razor blades are fabricated on a standard mono-crystalline silicon wafer with top and bottom surfaces using semiconductor industry etching techniques.

Figure 1A:
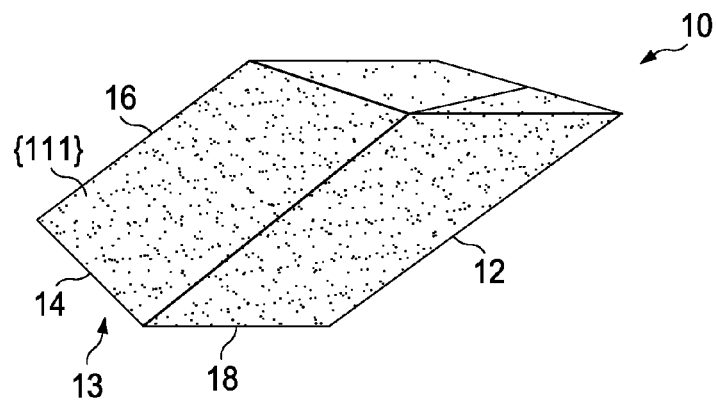
FIG. 1a is a perspective view of a silicon razor blade according to one embodiment of the present invention.
Figure 1B:
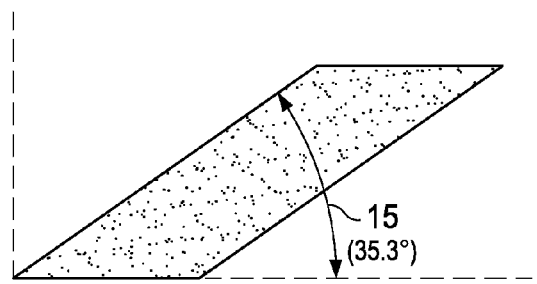

In FIGS. 1a and 1b, there are shown two views of a razor blade 10, manufactured in accordance with the methods of manufacturing described herein. As shown in FIG. 1a, the razor blade 10 includes a silicon body portion or substrate 12 with a wedge-shaped sharp edge having a tip 14. The tip 14 has a blade edge 13 having about a 35.3 degree included blade angle 15, as shown in FIG. 1b. Facets 16 and 18 diverge from the tip 14. The blade angle of tip 14 is determined by the intersection of the {110} and {111} planes. The facet 16 comprises the surface of the {111} plane, while the facet 18 comprises the {110} plane surface.

Figure 2A:
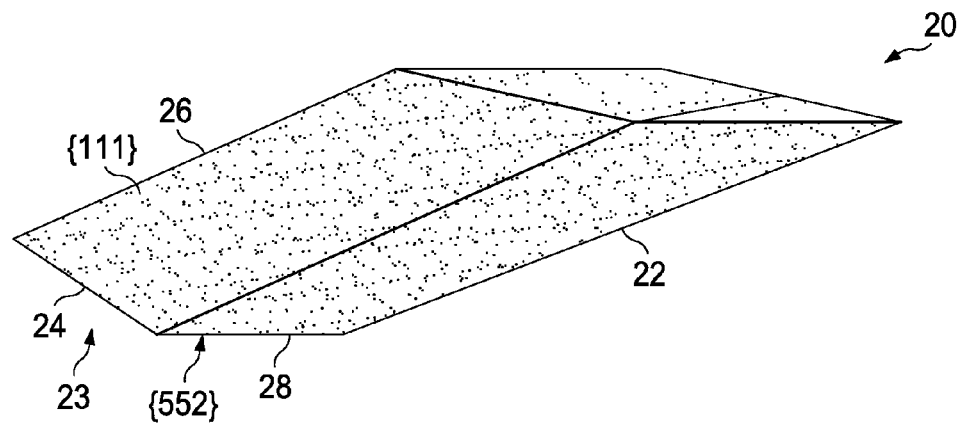
FIG. 2a is a perspective view of a silicon razor blade according to another embodiment of the present invention.
Figure 2B:
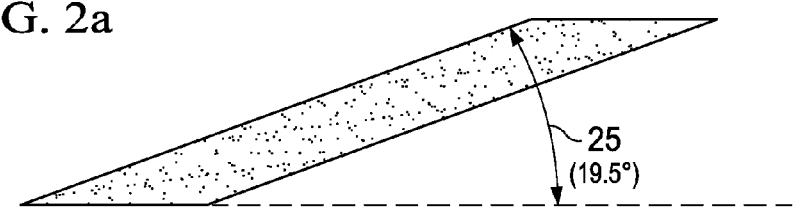

Turning now to FIGS. 2a and 2b, there are shown two views of a razor blade 20, manufactured in accordance with the methods of manufacturing described herein. As shown in FIG. 2a, the razor blade 20 includes a silicon body portion or substrate 22 with a wedge-shaped sharp edge having a tip 24. The tip 24 has a blade edge 23 of about a 19.5 degree included blade angle 25, as shown in FIG. 2b. Facets 26 and 28 diverge from the tip 24. The blade angle of tip 24 is determined by the intersection of the {552} and {111} planes. The facet 26 comprises the surface of the {111} plane, while the facet 28 comprises the surface of the {552} plane.

Manufacturing the razor blades of FIGS. 1a-2b includes aligning a mono-crystalline silicon wafer comprising a {100} surface at an angle where {111} planes intersect the {100} surface parallel and perpendicular to the wafer. The silicon wafer is etched between two planes to provide a blade edge having the appropriate blade angle. A hard coating is applied to the blade edge, wherein a radius of curvature of the blade edge is between about 20 nanometers and about 100 nanometers after deposition of the hard coating. A soft coating is also applied to the blade edge. The silicon razor blade is then removed from the mono-crystalline silicon wafer.

The silicon razor blades described herein can be made using physical etching techniques for forming ultra-fine three-dimensional silicon structures that are well known in the semiconductor industry, such as wet etching (e.g., chemical solution), dry etching (e.g., ion-beam), or a combination thereof.

In general, mono-crystalline silicon wafers are known to have a long-range order in atomic arrangement, and also a long-range order in direction dependency of bonding between atoms (e.g., covalent bonding between silicon atoms). Therefore, an intersection between crystal planes is maintained over the long range. By using this intersection as a cutting edge, the present invention makes it possible to form a razor blade with an ultra-fine cutting edge using the above-described silicon micromachining techniques. The base silicon material for formation of the razor blades is a single crystal silicon with the preferred crystal orientation defined herein. However, other orientations of mono-crystalline silicon are suitable, as is poly-crystalline silicon.

Figure 3:
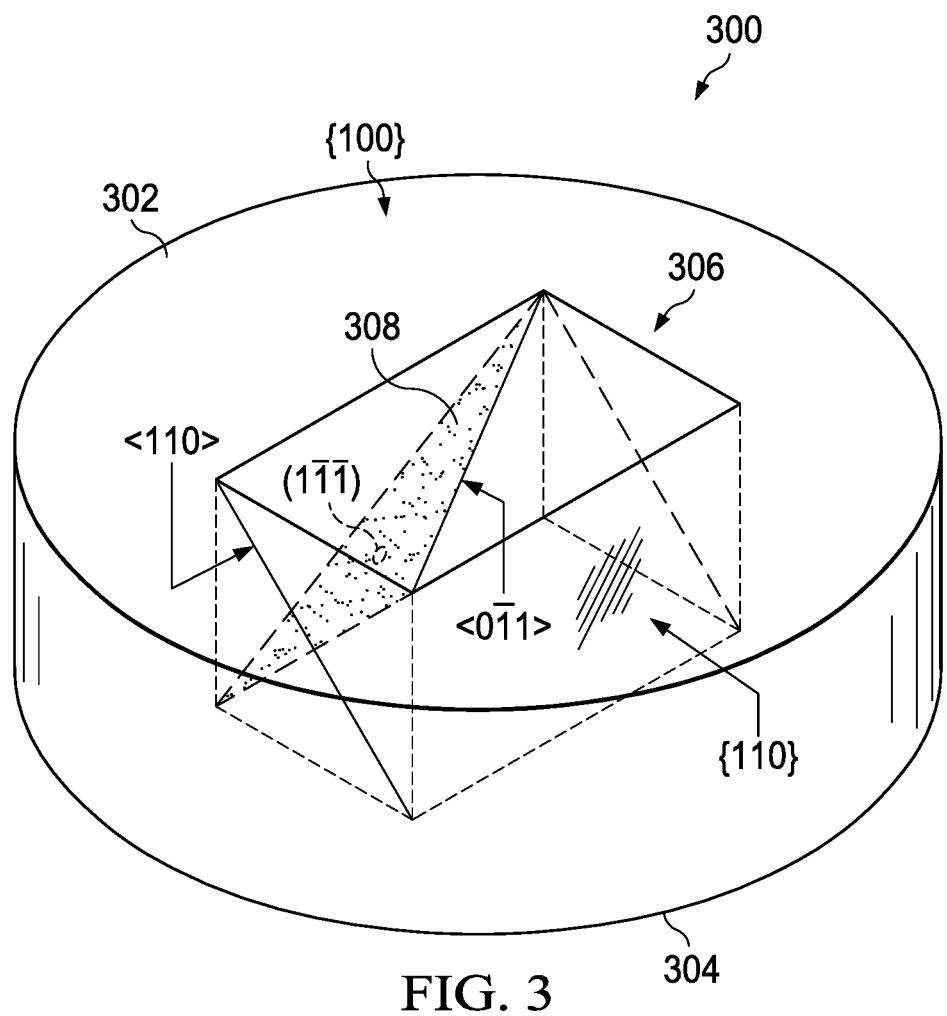
FIG. 3 is a perspective view of a monocrystalline silicon wafer according to one embodiment of the present invention.

To aid in understanding, FIG. 3 illustrates an embodiment of a standard monocrystalline silicon wafer 300 having a top surface 302 and a bottom surface 304, both a {100} surface, and showing a partial portion of the cubic lattice 306. When wafer 300 is oriented parallel to a <110> orientation, a masking layer can be applied such that the top surface 302 can be subjected to chemical etching, whereby an inclined plane 308, in this embodiment a {111} plane, is formed (i.e., revealed). In the embodiment of FIG. 3, the wafer 300 is oriented to a <0$\bar{1}$1> orientation, but it is understood that the orientation can be in any {110} plane direction. Likewise, the inclined plane 308 revealed by the etching is the (1$\bar{1}\bar{1}$) plane, but it is also understood that any {111} plane can be revealed in a <110> direction.

Figure 4:
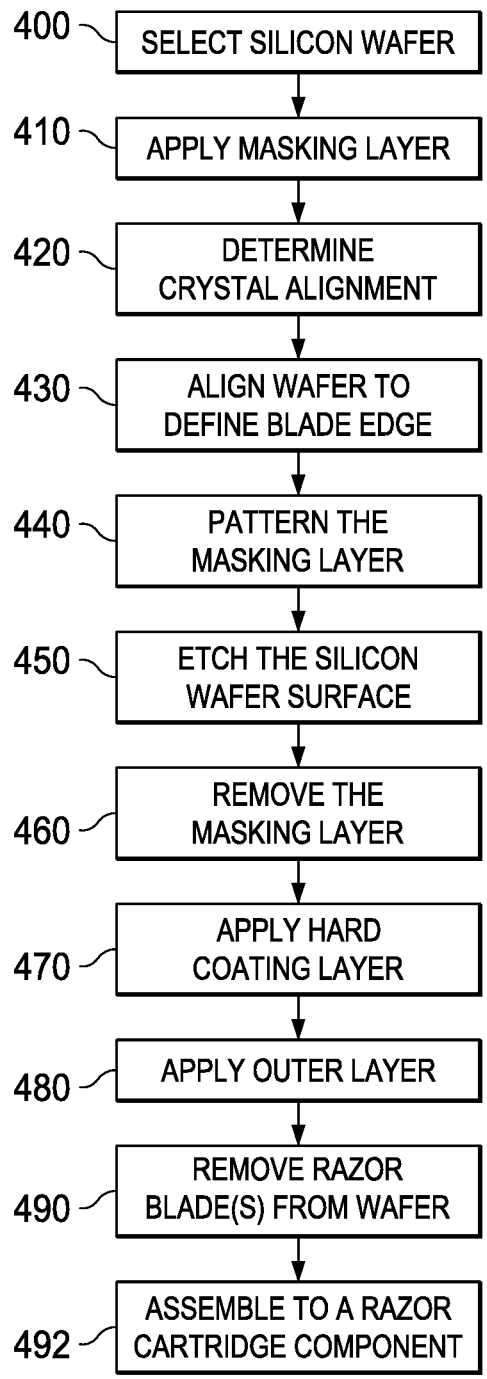
FIG. 4 is a flow diagram of a method of manufacturing razor blades from silicon, according to one embodiment of the present invention.

Referring now to FIG. 4, a flow diagram of a method of manufacturing razor blades from silicon according to one embodiment is illustrated. A mono-crystalline silicon wafer is preferably selected as the substrate in which to form the razor blades, as shown in step 400. There is no limitation with respect to thickness of the silicon wafer used to form the razor blades. Therefore, when the rigidity of the razor blade is needed, a relatively thick wafer can be used. On the other hand, a relatively thin silicon wafer (e.g., about 350 micrometers) may be used to form razor blades suitable for close shaving. The silicon wafer can be secured to a mounting assembly, if desired.

Figure 4A:
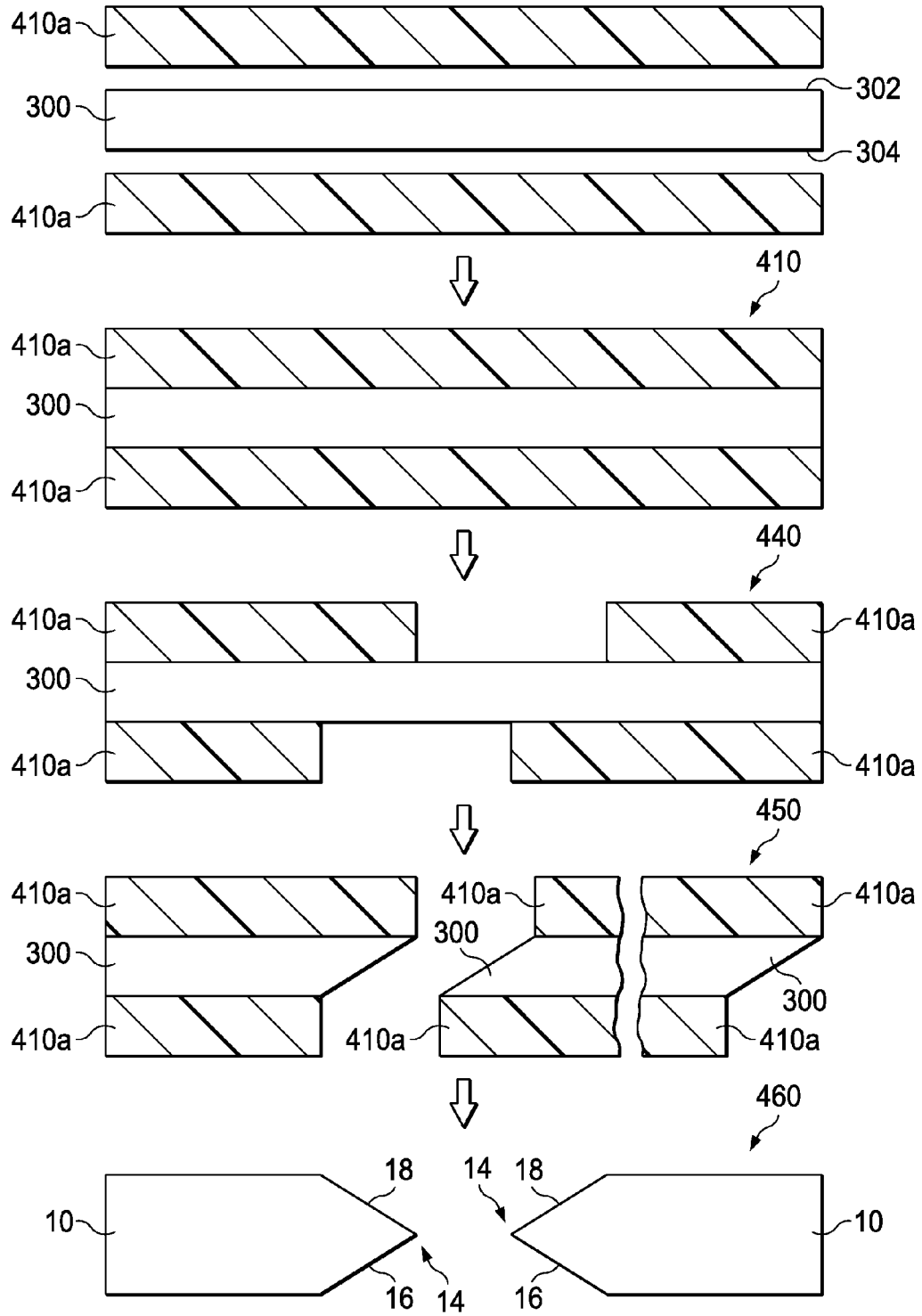
FIG. 4a is a more detailed flow diagram of FIG. 4.

In step 410, a masking layer 410a is applied to the top and bottom surfaces of the silicon wafer (e.g., surfaces 302 and 304 of FIG. 3) as shown in FIG. 4a. The masking layer can be applied to each of the top and bottom surfaces independently, or to both surfaces simultaneously. The masking layer can be applied using any number of thin film deposition processes, such as chemical vapor deposition (CVD), electrodeposition, physical vapor deposition (PVD), spin coating, spraying, painting, and the like. In one embodiment, the masking layer step 410 is performed by low pressure CVD of silicon nitride. However, other possible masking layers are envisioned that possess a high selectivity relative to the silicon wafer substrate material, such as silicon oxide, chromium gold, and the like. The masking layer can have a thickness of about 200 nanometers to about 500 nanometers.

The crystal alignment of the silicon wafer is determined in step 420, so that the desired planes of the silicon wafer are identified. For the razor blades embodied in FIGS. 1a-2b, the orientation of the intersecting line of the {111} plane surface and the silicon wafer surface (top or bottom) is determined. To find the orientation of the intersecting line, several known methods can be used. One alignment method is the Vangbo alignment, and it is based on the technique disclosed in the article "*Precise mask alignment to the crystallographic orientation of silicon wafers using wet anisotropic etching*," M. Vangbo and Y Backlund, J. Micromech, Microeng, 6 (1996), pp. 279-284 (describing a technique using fork structures to align the masking layer). The Vangbo alignment method is based on the symmetry of the silicon wafer surface to that of the {111} planes. This technique can be useful, because the orientation of the intersection line between, for example, the {111} plane and the {552} plane cannot be seen directly (i.e., optically) from the wafer surface. Additionally, the orientation will vary from wafer batch to wafer batch and even within a single wafer batch from wafer to wafer, because of the differences during dicing and polishing of the wafers. Further, although wafers used in common microelectromechanical systems fabrication tend to have symmetrical planes, the silicon wafers used as described herein to form blade edges suitable for shaving (e.g., 19.5-degree included angle), generally have asymmetrical planes. Other methods for aligning both sides of the wafer to form the blade edge in the masking layer can also be used, such as X-ray diffraction techniques, which utilize Bragg diffraction, or the utilization of terraces formed with {111} planes.

A double-sided alignment is then used in step 430 to define the blade edges in the masking layer, as the silicon wafer will generally be etched from both the top and bottom surfaces to form the final blade edge. In order to properly form the blade edges, it is important to precisely align the masking layer to the crystal planes of the silicon wafer. To create sharp and straight blade edges in the shortest time possible, the mask edge must be as close to parallel as possible to the intersection line of the {111} plane and the wafer surface.

Once the wafer is aligned to define the blade edge(s), the masking layer can be patterned for the desired razor blade shape. The mask is patterned in step 440 through known etching techniques, such as reactive ion etching, whereby the mask is removed from the substrate surface in the desired areas, thereby revealing the silicon wafer substrate in those areas.

To begin forming the razor blade shape, such as the above-described facets and the like, a conventional masked anisotropic etching process using the specifically patterned masking layer is used in step 450. The mono-crystalline silicon wafer is immersed in etching fluid, which is controlled for concentration and temperature. After a predetermined length of time has elapsed, the wafer is removed from immersion. During the anisotropic etching step 450, etching is performed from the portions of the silicon that are not covered by the masking layer on the wafer, thereby revealing the {111} plane along the mask pattern. In the peripheral portions of the masking layer, an inclined surface is thereby formed that slopes in relation to the top and bottom surfaces of the single-crystal silicon wafer, and etching progresses. Ultimately, inclined surfaces (e.g., facets 16 and 18 in FIG. 1a) forming from the top surface and bottom surface of the silicon wafer are formed through etching the substrate and ultimately meet to form the blade edge.

Chemical etching is a well-known process for removing silicon from a mono-crystalline silicon wafer in a uniform manner. For example, the profile on the top surface of the wafer can be uniformly brought down to intersect with the profile on the opposing bottom surface and form the razor blade shape. Chemical etching is used in order to achieve the desired blade sharpness while preserving the included blade angle. The bottom surface etch can be done simultaneously with the top surface etch or it can be done separately. Chemical etchant composition, temperature, agitation and duration should be controlled to achieve desired results Anisotropic or "orientation-dependent" etchants may etch much faster in one direction than in another. In potassium hydroxide (KOH), for example, etch rate of {111} planes is relatively slow compared to all other crystal planes of silicon. In general, the slowest etching planes are exposed as the etch progresses. It is known that etching inside corners in {100} silicon surfaces stops at intersecting {111} planes. For example, if an opening in an etch mask forms a rectangle, an anisotropic etching agent will etch down exposing {111} planes to form a V-type groove with respect to two opposing sides. When conducted on both sides of the wafer and with various etchants, temperatures, and time constraints, razor blade edges can be formed in the wafer. In one embodiment, the silicon wafer undergoes anisotropic etching at step 450 with the KOH etching agent. For example, the wafer can be submersed in a 25 percent by weight KOH solution in water at a temperature of about 70 degrees Celsius. Other combinations and concentrations can be used to achieve the same purpose. For example, other possible anisotropic etching agents are tetramethylammonium hydroxide (TMAH), hydrazine, an aqueous solution of ethylene diamine and pyrocatechol (EDP), and the like.

In one embodiment, an ultrasonic bath is used for the anisotropic chemical etching step 450. The ultrasonic bath helps to reduce the adherence of hydrogen, formed during etching, to the silicon surface.

After completion of the etching, the mask is removed in step 460 from the silicon wafer surfaces. For a silicon nitride masking layer, hydrogen fluoride solution can be used to remove the masking layer. Other masking materials can be removed with different etching agents. For example, chromium gold masking layers can be removed with potassium iodide (KI), perchloric acid, and cerium ammonium nitrate.

An inner layer, such as a hard coating, can then be applied to the surfaces of the razor blade. The inner layer step 470 can be conducted while the razor blade remains attached to the silicon wafer, or the inner layering step 470 can be done upon separation of the razor blade from the wafer. When the inner layer is a hard coating layer disposed on at least the blade edge of the razor blade, it can provide improved strength, improved corrosion resistance and improved shaving ability. The hard coating layer can be made from fine-, micro-, or nano-crystalline carbon-containing materials (e.g., diamond, amorphous diamond or diamond like carbon (DLC)), nitrides (e.g., boron nitride, niobium nitride, silicon nitride, chromium nitride, zirconium nitride, or titanium nitride), carbides (e.g., silicon carbide), oxides (e.g., alumina, zirconia) or other ceramic materials (including nanolayers or nanocomposites). The carbon containing materials can be doped with other elements, such as tungsten, titanium, silver, or chromium by including these additives, for example in the target during application by sputtering. The materials can also incorporate hydrogen, e.g., hydrogenated DLC. In one embodiment, the hard coating layer disposed on the silicon razor blade is made of silicon nitride. In another embodiment, the hard coating layer disposed on the silicon razor blade is made of DLC. The hard coating layer can have a thickness of less than about 3,000 angstroms; specifically from about 500 angstroms to about 1,500 angstroms. The hard coating layer is applied to the blade edge wherein a radius of curvature of the blade edge is between about 20 nanometers and about 1000 nanometers after application. Radius of curvature, also known as edge radius or cutting radius, is the radius of the sharpened edge that cuts the facial hair. A smaller radius of curvature generally correlates to a sharper blade. In one embodiment, the silicon razor blade has a radius of curvature between about 50 nanometers and about 150 nanometers.

Methods of depositing the inner hard coating layer can include, well known methods such as, plasma chemical vapor deposition (PCVD), plasma-enhanced chemical vapor deposition (PECVD), and the like. Depending upon the hard coating material and method of deposition chosen, each side of the razor blade can be coated simultaneously, or each side can be coated separately (e.g., the {111} blade facet coated first and the {552} blade facet coated second). This layer provides added strength.

An outer layer is applied on the inner hard coating layer of the silicon razor blade in an outer layer application step 480. The outer layer, also sometimes referred to a soft coating layer, is used to provide reduced friction during shaving. The outer layer may be a polymer composition or a modified polymer composition. The polymer composition may be polyfluorocarbon. A suitable polyflourocarbon is polytetrafluoroethylene (PTFE), sometimes referred to as a telomer. This material is a nonflammable and stable dry lubricant that consists of small particles that yield stable dispersions. It may generally be furnished as an aqueous dispersion of about 20% solids by weight and can be applied by dipping, spraying, or brushing, and can thereafter be air dried or melt coated. The silicon razor blades may be heated prior to application of the outer layer. In one embodiment, the silicon razor blades are heated to about 120 degrees Celsius before an aqueous dispersion of PTFE is spray coated thereon. The outer layer is preferably less than about 5,000 angstroms and could typically be about 1,500 angstroms to about 4,000 angstroms, and can be as thin as about 100 angstroms, provided that a continuous coating is maintained. Masks can be used during the outer layer application step 480 to help prevent non-cutting sides of the razor blades from being coated with the outer layer. This can improve the ability of the non-cutting sides of blades to then be attached to a blade support, or the like, in a razor cartridge. For example, some methods for attaching blades use glue. Glue, however, generally does not adhere well to some outer layer materials, such as PTFE.

Figure 6:
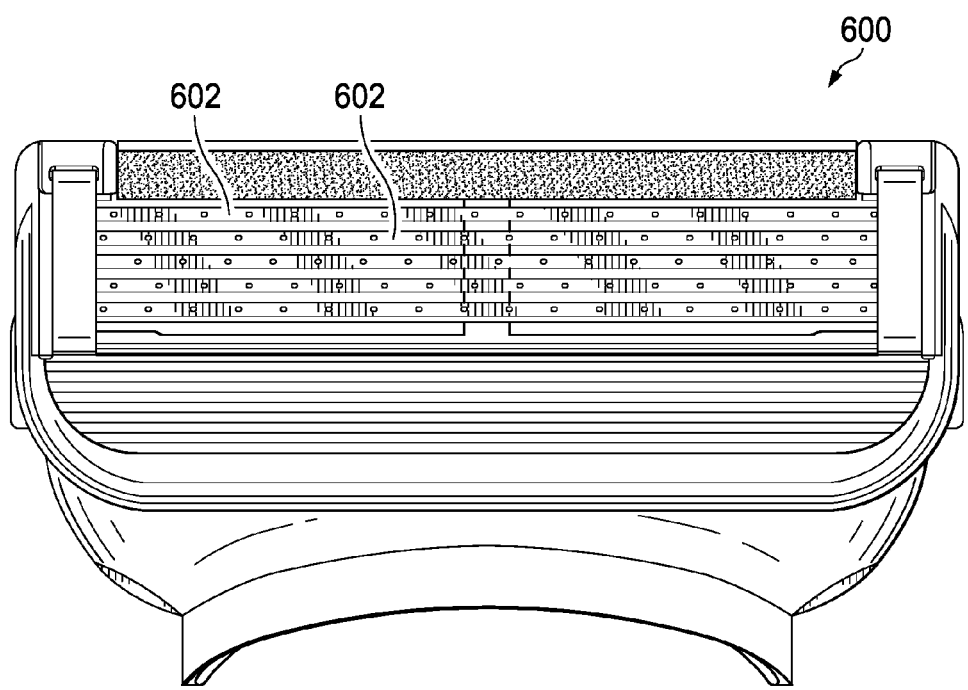
FIG. 6 is a perspective view of a razor cartridge having silicon razor blades, according to one embodiment of the present invention.

The silicon razor blade can be removed from the wafer, in step 490, by any means suitable for separating the blade from the wafer without damage to the blade, particularly the fine edges. The razor blade can be mechanically cut, such as with a saw, laser-cut, water-cut, snapped, and the like. Once free from the wafer substrate, the razor blade can be assembled into a razor cartridge, as is well-known in the razor art. For example, one or more silicon razor blades are adhered to blade supports and assembled into razor cartridge housings. Once removed from the wafer, the blades can then be assembled into a razor cartridge at step 492. For example, the blades can be attached to blade supports, which can then be installed in a razor cartridge housing. An example of a razor cartridge housing 600 is illustrated in FIG. 6. The razor cartridge 600 includes a plurality of silicon razor blades 602.

Figure 5:
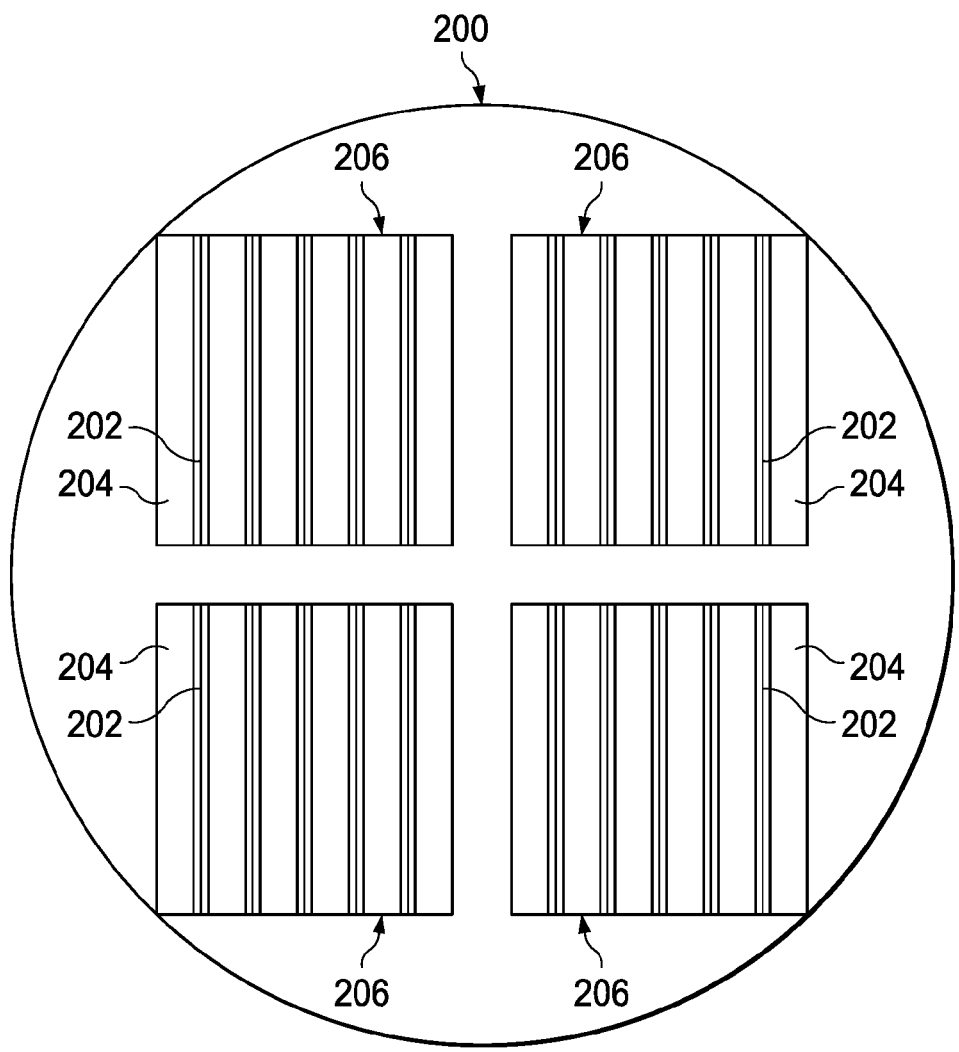
FIG. 5 is a perspective view of a silicon wafer having a plurality of razor blades formed therein according to one embodiment of the present invention.

While the methods of manufacturing described herein have been referred to with primary reference to a single razor blade, the methods are easily applicable to the manufacture of multiple razor blades simultaneously. In FIG. 5, a silicon wafer 200 having a plurality of silicon razor blades 202 produced in accordance with the methods described herein is illustrated. Manufacture of the silicon wafer 200 to produce the plurality of razor blades 202 includes sequential surface masking, patterning of the mask (e.g., photolithographically) and selective material removal in wet and/or dry etch chemistries. After batch manufacture of the plurality of razor blades 202 on the silicon wafer 200, the blades are separated by sawing, dicing, and the like, and are ready for further assembly into razor cartridges. Looking more closely at FIG. 5, the plurality of razor blades are clustered together in groups of five blades. The clusters have a generally rectangular shape and for ease in discussion are referred to herein as blade boxes 204. The plurality of razor blades 202 can be manufactured in this clustered organization to reduce downstream process steps in the shaving razor system assembly. The blade boxes 204 have 5 individual razor blades 202, as illustrated, enclosed by a perimeter 206. The blade boxes 204 can be manufactured identically, or they can be different, such as each box having differences in blade spacing, included blade angles, number of blades, orientation of the blades, and the like. The differences can be made via changes to the various method steps described above, such as masking patterns, and the like. A blade box 204 can be removed from the wafer 200 by sawing around the perimeter 206, such that the self-contained blade box 204 is a singular unitary part. The blade box could then be inserted into the housing of a razor cartridge. Assembling the razor cartridge in such a manner eliminates the difficult steps of affixing each individual razor blade to a blade support, inserting each blade support-razor blade pair in the razor cartridge housing, and aligning each separate razor blade to the desired blade height, angle, and spacing. By utilizing the method described herein, the plurality of razor blades are aligned and secured in the blade box, thereby eliminating the need to affix individual blade supports and the difficult process of aligning 5 separate razor blades into the razor cartridge housing. While FIG. 5 illustrates blade boxes 204 having 5 razor blades, it is to be understood that any number of razor blades can be clustered together, such as 2, 3, 4, 5, or more.

It should further be noted that while the blades illustrated in the figures have generally linear blade edges, other blade shapes and edge patterns can be produced by the methods described herein.

One of the many advantages to producing razor blades for shaving from silicon in the manner described herein, is that blade edges formed have very little surface roughness. The peak-valley dimensional surface roughness for the razor blades are between about 100 nanometers to about 200 nanometers. A very low surface roughness provides for a more comfortable shave and less skin irritation experienced by the user.

Accordingly, other embodiments are within the scope of the following claims.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for manufacturing at least one razor blade comprising:
    providing a mono-crystalline silicon wafer comprising a {100} surface;
    etching the mono-crystalline silicon wafer at an angle relative to the surface {100} to expose an {111} plane where the {111} plane intersects the {100} surface at an angle and a second plane to provide at least one blade edge having between about a 19.5 degree included blade angle and about a 35.3 degree included blade angle;
    applying at least one inner layer on the at least one blade edge;
    providing a radius of curvature of the at least one blade edge between about 20 nanometers and about 100 nanometers after deposition of the at least one inner layer;
    applying at least one outer layer on the at least one blade edge; and
    removing the at least one razor blade from the mono-crystalline silicon wafer.

2. The method of claim 1, wherein the second plane is a {110} plane.

3. The method of claim 1, wherein the second plane is a {552} plane.

4. The method of claim 1, further comprising applying a masking layer to the mono-crystalline silicon wafer prior to the aligning step.

5. The method of claim 4, further comprising patterning the masking layer to define a profile of the at least one razor blade.

6. The method of claim 1, wherein the at least one inner layer comprises a hard coating.

7. The method of claim 6, wherein the hard coating comprises diamond, diamond-like carbon, amorphous diamond, boron nitride, niobium nitride, silicon nitride, chromium nitride, zirconium nitride, titanium nitride, silicon carbide, alumina, zirconia, or any combination thereof.

8. The method of claim 4, further comprising removing the masking layer before applying the at least one inner layer.

9. The method of claim 7, further comprising applying a second masking layer before applying the at least one outer layer.

10. The method of claim 1, wherein the at least one outer layer comprises a soft coating.

11. The method of claim 9, wherein the soft coating comprises polytetrafluoroethylene.

12. The method of claim 1, wherein the at least one inner layer is applied after removing the at least one razor blade from the silicon wafer.

13. The method of claim 1, wherein the at least one inner layer is applied before removing the at least one razor blade from the silicon wafer, wherein the at least one inner layer is first applied to a first side of the at least one razor blade and then applied to a second side of the at least one razor blade opposite the first side.

14. The method of claim 1, further comprising forming at least one blade box on the silicon wafer, each comprising a plurality of razor blades.

15. The method of claim 14, wherein the at least one blade box has a perimeter encasing the plurality of razor blades.

16. The method of claim 1, further comprising disposing the razor blade in a razor cartridge housing.

17. The method of claim 16, further comprising disposing the at least one blade box in a razor cartridge.

18. A razor cartridge formed using the method of claim 1.

19. The method of claim 1, wherein a variation in a surface roughness of the at least one razor blade is between about 100 nanometer to 200 nanometers.

* * * * *